(12) United States Patent
Kim et al.

(10) Patent No.: US 7,796,063 B2
(45) Date of Patent: Sep. 14, 2010

(54) DATA TRANSMISSION CIRCUITS AND DATA TRANSCEIVER SYSTEMS

(75) Inventors: Jong-Seok Kim, Yongin-si (KR); Nam-Hyun Kim, Yongin-si (KR); Cheon-Oh Lee, Cheonan-si (KR); Han-Kyul Lim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 26 days.

(21) Appl. No.: 12/289,889

(22) Filed: Nov. 6, 2008

(65) Prior Publication Data
US 2009/0167573 A1 Jul. 2, 2009

(30) Foreign Application Priority Data
Nov. 7, 2007 (KR) .................. 10-2007-0112941

(51) Int. Cl.
*H03M 9/00* (2006.01)
(52) U.S. Cl. ...................... 341/100; 341/101
(58) Field of Classification Search ............... 341/100, 341/101
See application file for complete search history.

(56) References Cited

U.S. PATENT DOCUMENTS

| | | | |
|---|---|---|---|
| 6,628,679 B1 * | 9/2003 | Talarek ............... | 370/536 |
| 7,015,838 B1 * | 3/2006 | Groen et al. ............ | 341/100 |
| 7,146,284 B2 * | 12/2006 | Ko et al. ................ | 702/117 |
| 2004/0165611 A1 | 8/2004 | Govindarajan et al. | |
| 2005/0231399 A1 * | 10/2005 | Fowler et al. ........... | 341/100 |
| 2007/0121711 A1 | 5/2007 | Offord et al. | |

* cited by examiner

*Primary Examiner*—Jean B Jeanglaude
(74) *Attorney, Agent, or Firm*—Harness, Dickey & Pierce, P.L.C.

(57) ABSTRACT

A transmission circuit includes a serial clock generator, a serializer and a transmission clock generator. The serial clock generator generates a serial clock. The serializer serializes N-bit parallel data to N-bit serial data in synchronization with the serial clock. The transmission clock generator receives the serial clock to generate a transmission clock that has a same delay as the N-bit serial data, and the data transmission circuit simultaneously transmits the N-bit serial data and the serial clock.

14 Claims, 6 Drawing Sheets

DATA TRANSMISSION CIRCUITS AND DATA TRANSCEIVER SYSTEMS

PRIORITY STATEMENT

This non-provisional U.S. Patent application claims priority under 35 U.S.C. §119 to Korean Patent Application No. 10-2007-112941, filed on Nov. 7, 2007, in the Korean Intellectual Property Office, the entire contents of which is incorporated herein by reference.

BACKGROUND

Description of the Related Art

Generally, serializers and deserializers may be used for reducing pins of an interfacing device when two circuits are connected in a data communication device.

When data are transmitted in a bus architecture, parallel data may be converted to serial data in a transmitter chip, the serial data converted to differential signals having reduced swing levels for high speed transmission, and the differential signals transmitted outside of the transmitter chip. This may occur in media technology fields because media data such as display data have greatly increased. When data are transmitted at high speed, data and a clock may be simultaneously transmitted to a receiving device and data may berecovered based on a clock in the receiving device. However, the data may not be easily recovered based on the clock in the receiving device as a skew between the data and the clock increases. The skew may occur between the data and the clock because a delay occurs in the receiving device or a transmission line. Therefore, there is a need for reducing the skew between the data and the clock.

SUMMARY

Example embodiments provide a data transmission circuit capable of reducing a skew between data and a clock when the data is transmitted at high speed.

Example embodiments provide a data transmission and reception system capable of reducing a skew between data and a clock when data is transmitted and received at high speed.

According to at least some example embodiments, a data transmission circuit includes a serial clock generator, a serializer and a transmission clock generator. The serial clock generator may generate a serial clock. The serializer may serialize N-bit parallel data to N-bit serial data in synchronization with the serial clock. The transmission clock generator may receive the serial clock to generate a transmission clock that has a same delay as the N-bit serial data, and the data transmission circuit simultaneously transmits the N-bit serial data and the serial clock.

In at least some example embodiments, the serializer and the transmission clock generator may have a same circuit configuration.

In at least some example embodiments, the data transmission circuit may further include a data buffer that receives the N-bit serial data to convert the received N-bit serial data into first and second data signals that have reduced swing levels and a clock buffer that receives the transmission clock to convert the received the transmission clock into first and second clock signals that have reduced swing levels. The first and second data signals may be differential signals. The first and second clock signals may be differential signals.

In at least some example embodiments, the serializer may include first N multiplexers and first N flip-flops. Each of the first N multiplexers has a first input terminal that receives a bit of the N-bit parallel data and a second input terminal that receives a shifted value of a previous bit of the N-bit parallel data. The first N flip-flops, each of which is coupled to at least one of the first N multiplexers, may receive and delay outputs of the first N multiplexers to provide the N-bit serial data.

In at least some example embodiments, the serializer may provide the N-bit serial data by shifting the N-bit parallel data input to the N multiplexers by one bit, when a first control signal input to the N multiplexers is enabled.

In at least some example embodiments, the transmission clock generator may include second N multiplexers and second N flip-flops. Each of the second N multiplexers may have a first input terminal that receives a first or a second logic value levels and a second input terminal that receives a shifted logic value based on the first and second logic value levels. The first and second logic value levels may alternate among the second N multiplexers. The second N flip-flops, each of which is coupled to at least one of the second N multiplexers in a chain configuration, may receive and delay outputs of the second N multiplexers to provide the transmission clock.

In at least some example embodiments, the transmission clock generator may provide the transmission clock by shifting the first and second logic value levels to the N multiplexers when a second control signal input to the second N multiplexers is enabled. The transmission clock may have a period that is two times longer than a period of the serial clock.

According to at least some example embodiments, a data transmission and reception system includes a serializer, a transmission clock generator, and a deserializer. The serializer may serialize N-bit parallel data to N-bit serial data in synchronization with a serial clock. N is a natural number greater than one. The transmission clock generator may receive the serial clock to generate a transmission clock that has a same delay as the N-bit serial data. The deserializer may receive the N-bit serial data and the transmission clock to deserialize the N-bit serial data to the N-bit parallel data in synchronization with the serial clock, and the N-bit serial data and the transmission clock are simultaneously transmitted.

In at least some example embodiments, the deserializer may deserialize the N-bit serial data to the N-bit parallel data by having a symmetric circuit configuration with respect to the serializer.

In at least some example embodiments, the serializer and the transmission clock generator may have a same circuit configuration In at least some example embodiments, the serializer may include first N multiplexers and first N flip-flops. Each of the first N multiplexers may have a first input terminal that receives a bit of the N-bit parallel data and a second input terminal that receives a shifted value of a previous bit of the N-bit parallel data. The first N flip-flops, each of which is coupled to at least one of the first N multiplexers, may receive and delay outputs of the first N multiplexers to provide the N-bit serial data.

In at least some example embodiments, the transmission clock generator may include second N multiplexers and second N flip-flops. Each of the second N multiplexers may have a first input terminal that receives a first or a second logic value level, the first and second logic value levels alternating among the second multiplexers, and a second input terminal that receives a shifted logic value based on the first or second logic value level. The second N flip-flops, each of which is coupled to at least one of the second N multiplexers, may receive and delay outputs of the second N multiplexers to provide the transmission clock.

Accordingly, data may be easily recovered in a receiving device by reducing skews between the data and the clock when data are transmitted at high speed.

BRIEF DESCRIPTION OF THE DRAWINGS

Example embodiments will be more clearly understood from the following detailed description in conjunction with the accompanying drawings, in which.

DETAILED DESCRIPTION OF EXAMPLE EMBODIMENTS

Figure 1:
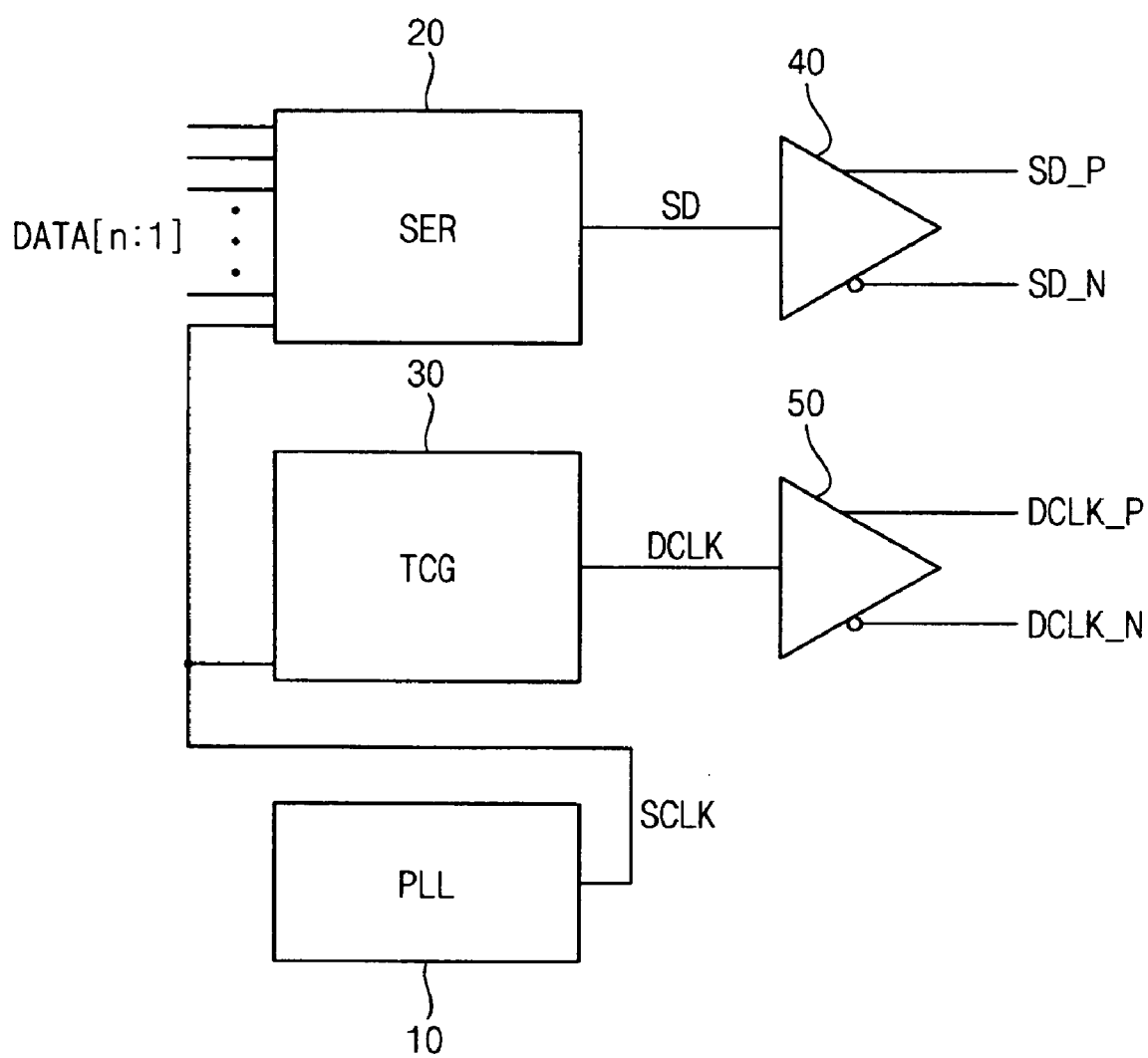
FIG. 1 is a block diagram illustrating a data transmission circuit according to an example embodiment.

Various example embodiments will be described more fully with reference to the accompanying drawings, in which some example embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

FIG. 1 is a block diagram illustrating a data transmission circuit 100 according to an example embodiment.

Referring to FIG. 1, the data transmission circuit 100 may include a serial clock generator 10, a serializer 20 and a transmission clock generator 30. The data transmission circuit 100 may further include a data buffer 40 and a clock buffer 50.

The serial clock generator 10 generates a serial clock SCLK. The serial clock generator 10 may be implemented with a phase-locked loop (PLL). While FIG. 1 illustrates a PLL, it should be understood that any suitable clock generator may be used.

The serializer 20 may receive N-bit parallel data and serialize the received N-bit parallel data output to N-bit serial data SD. Here, N may be a natural number greater than one. The transmission clock generator 30 may receive the serial clock SCLK to generate a transmission clock DCLK that has a same delay as the N-bit serial data SD. The transmission clock generator 30 and the serializer 20 may have a similar or substantially similar circuit configuration.

The data buffer 40 may receive the N-bit serial data SD to output first and second data signal SD_P and SD_N that have reduced swing levels. The first and second data signal SD_P and SD_N may be differential signals. The serial data SD may be converted to the first and second data signal SD_P and SD_N by the data buffer 40 so that data may be transmitted at high speed.

The clock buffer 50 may receive the transmission clock DCLK to output first and second clock signals DCLK_P and DCLK_N. The data transmission circuit 100 may simultaneously transmit the serial data SD and the transmission clock DCLK and/or the data transmission circuit 100 may simultaneously transmit the first and second data signal SD_P and SD_N and the first and second clock signals DCLK_P and DCLK_N.

Figure 2:
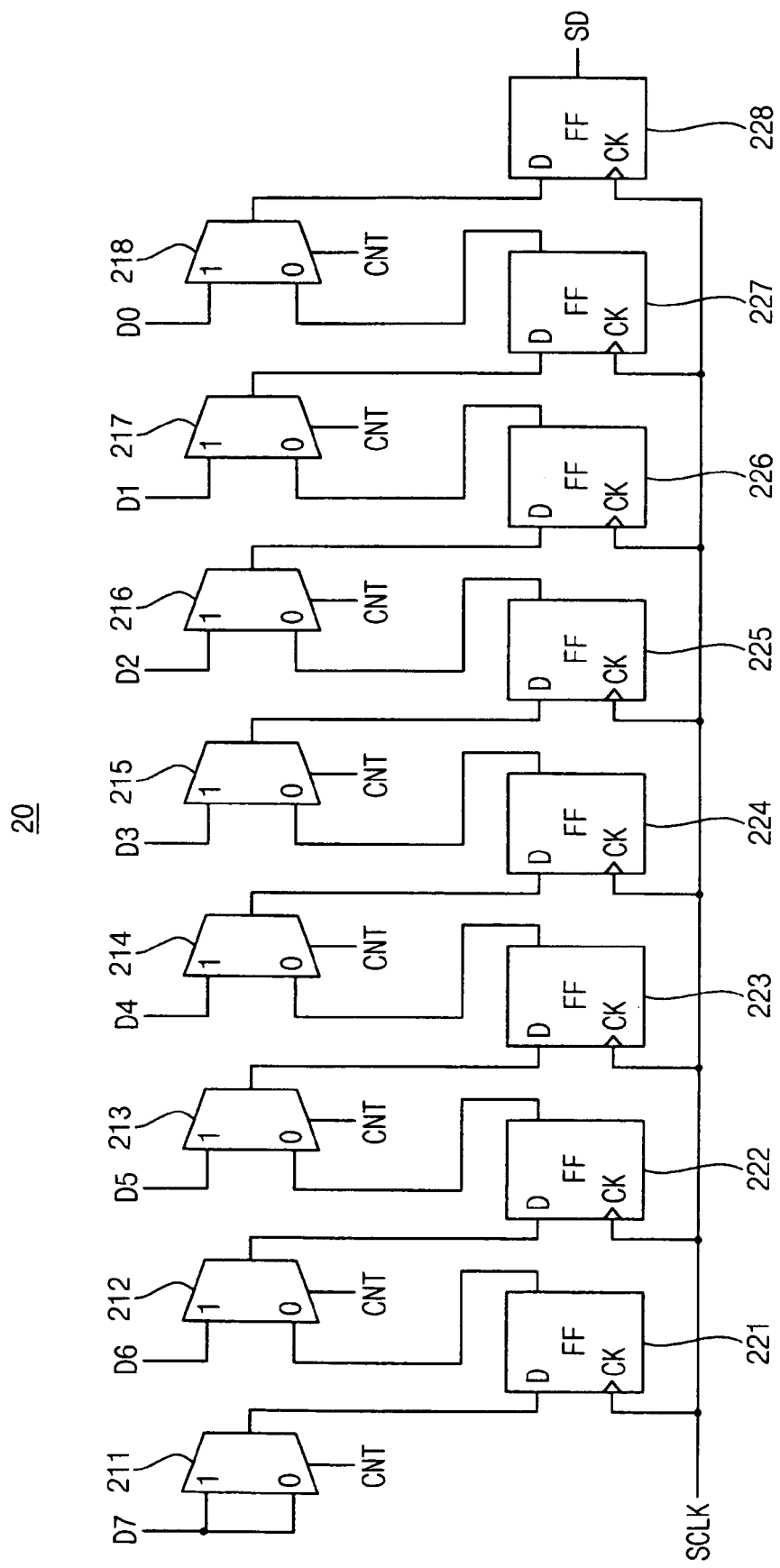
FIG. 2 is an example of embodiment of a serializer in the data transmission circuit of FIG. 1.

FIG. 2 illustrates an example embodiment of the serializer 20 in the data transmission circuit 100 of FIG. 1. In FIG. 1, N may correspond to eight. That is, for convenience of description, FIG. 2 illustrates the serializer 20 that may serialize eight-bit parallel data to eight-bit serial data.

Referring to FIG. 2, the serializer 20 may include a plurality of multiplexers 211-218, and a plurality of flip-flops 221-228. Each of the plurality of multiplexers 211-218 may include first and second input terminals 1 and 0 and an output. Each of the flip-flops 221-228 may include an input D, a clock input CK and an output.

Each bit of eight-bit data D7-D0 may be applied to a first input terminal 1 of the multiplexers 211-218. For example, D7 may be input to the first input terminal 1 of the multiplexer 211. Each previous bit of the eight-bit data D7-D0 may be applied to a second input terminal 0 for each of the multiplexers 211-218. For example, D7 may be input to a pin 0 of the multiplexer 212. Data D7 may be applied to the second input terminal 0 of the multiplexer 211. The outputs of the multiplexers 211-218 may be applied to the inputs D of the flip-flops 221-228, respectively. The serial clock SCLK may be applied to each clock input CK of the flip-flops 221-228. A control signal CNT may be applied to each of the multiplexers 211-218.

Figure 3:
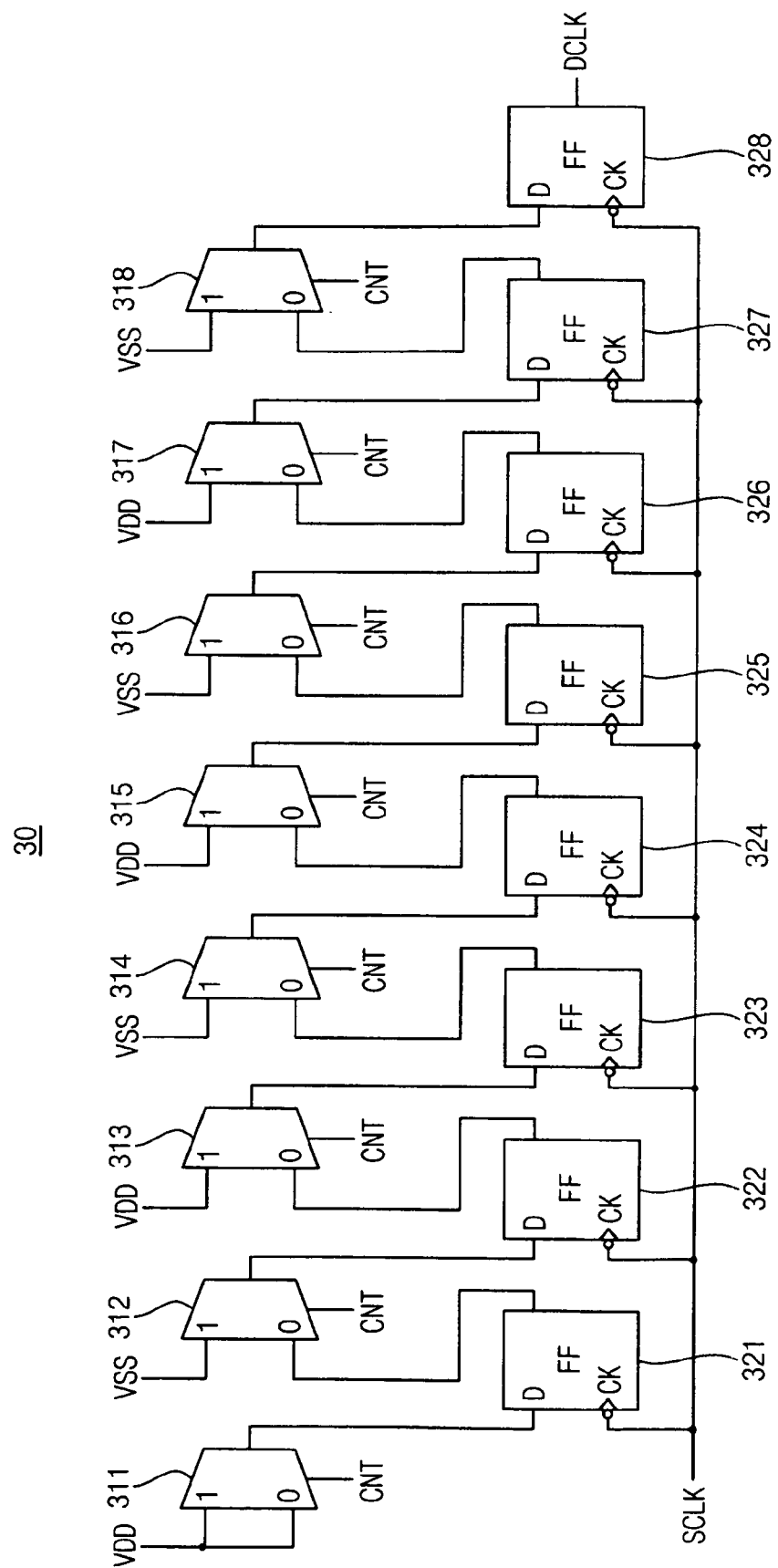
FIG. 3 is an example of embodiment of a transmission clock generator in the data transmission circuit of FIG. 1.

The flip-flops 221-228 may be coupled to the multiplexers 211-218 in a chain configuration. The flip-flops 221-228 may receive and delay outputs of the multiplexers 211-218 by one clock to output the serial data SD at the flip-flop 228. The flip-flop 228 outputs the serial data SD in an order of data D0 to data D7. For example, FIG. 3 illustrates an example embodiment of the transmission clock generator 30 in the data transmission circuit 100 of FIG. 1. In FIG. 3, N may be eight as in the serializer 20 of FIG. 2.

Referring to FIG. 3, the transmission clock generator 30 may include a plurality of multiplexers 311-318, and a plurality of flip-flops 321-328. The flip-flops 321-328 may be coupled to the multiplexers 311-318 in a chain configuration. The flip-flops 321-328 may delay inputs to first input terminals 1 of the multiplexers 311-318 by one period of the serial clock SCLK in an order from the multiplexer 318 to multiplexer 311 to sequentially provide the transmission clock signal DCLK in synchronization with the serial clock. The flip-flop 328 may output the transmission clock signal DCLK in an order of data D0 to data D7.

Each of the plurality of multiplexers 311-318 may include first and second input terminals 1 and 0. The first input terminal 1, for each of the multiplexers 311-318 may receive each of eight logic values alternating between two levels, i.e., logic high level and logic low level. That is, each of the first input terminals 1 for the multiplexers 311, 313, 315 and 317 max receive logic high level, i.e., logic one, and each of the first input terminals 1 for the multiplexers 312, 314, 316 and 318 max receive logic low level, i.e., logic zero.

The second input terminal 0 for the multiplexer 311 max receive logic high level, i.e., logic one. The second input terminals 0 for the multiplexers 312-318 may receive the outputs of the flip-flops 321-327 respectively. The inputs D of the flip-flops 321-328 may receive the outputs of the multiplexers 311-318, respectively. Each clock input for the flip-flops 321-328 receive the serial clock SCLK. The control signal CNT also may be applied to the multiplexers 311-318. A period of the transmission clock signal DCLK may be two times as long as a period of the serial clock SCLK.

The serial data SD and the serial clock DCLK may have a same delay because the serializer 20 of FIG. 2 and the transmission clock signal generator 30 have a similar or substantially similar circuit configuration. Therefore, data may be easily recovered from a clock of a receiving device because the data transmission circuit 100 may simultaneously transmit the serial data SD and the serial clock DCLK.

Figure 4:
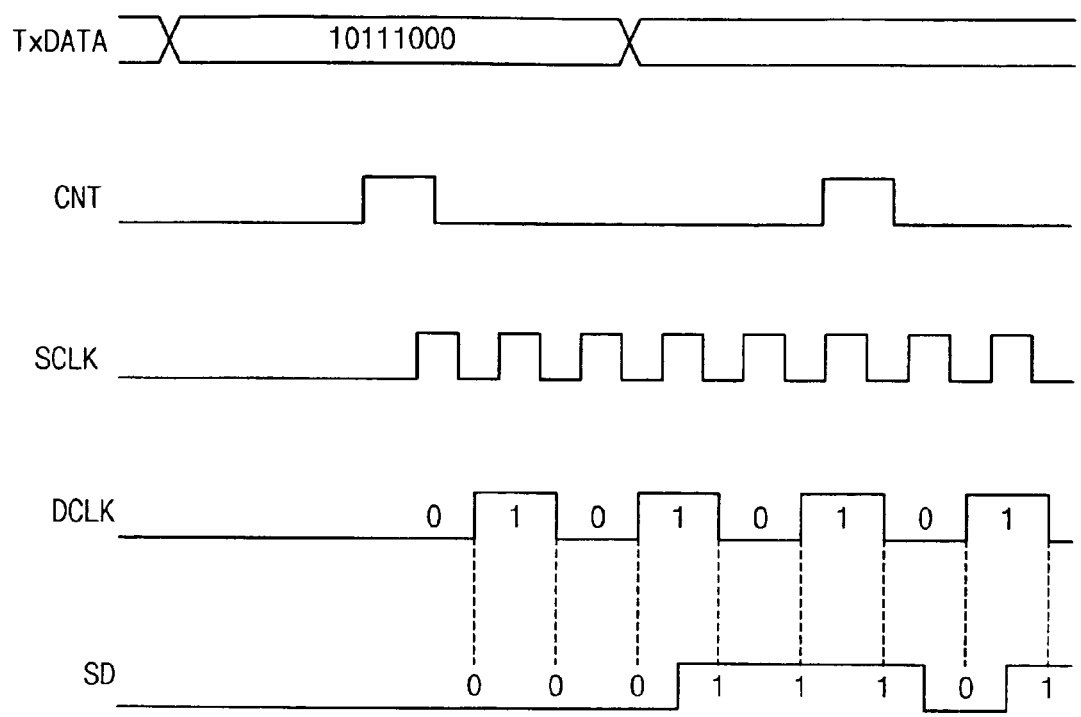
FIG. 4 is a timing diagram of an example embodiment of the data transmission circuit shown in FIG. 1.

FIG. 4 is a timing diagram of an example embodiment illustrating parallel data TxDATA, the control signal CNT, the serial clock SCLK, the transmission clock DCLK, and the serial data SD in case that N is eight in FIGS. 1 through 3.

In FIG. 4, eight-bit parallel data TxDATA such as 10111000 may be applied to the serializer 20. Data D7-D0, such as 10111000, may be applied to first input terminals 1 of the multiplexers 211-218, respectively.

Referring to FIG. 4, the transmission clock DCLK maybe more delayed than the serial clock SCLK. For example, the transmission clock DCLK may have a same delay as the serial data SD and the period of the transmission clock signal DCLK may be two times as long as the period of the serial clock SCLK. A rising edge and a falling edge of the transmission clock signal DCLK may be placed at a center of each data value of the serial data SD output from the serializer 30. Correct data may be recovered when the serial data SD is recovered at the rising edge and the falling edge of the transmission clock signal DCLK.

The data transmission circuit 100 of FIG. 1 may be applicable when a plurality of N-bit parallel data is simultaneously serialized.

Figure 5:
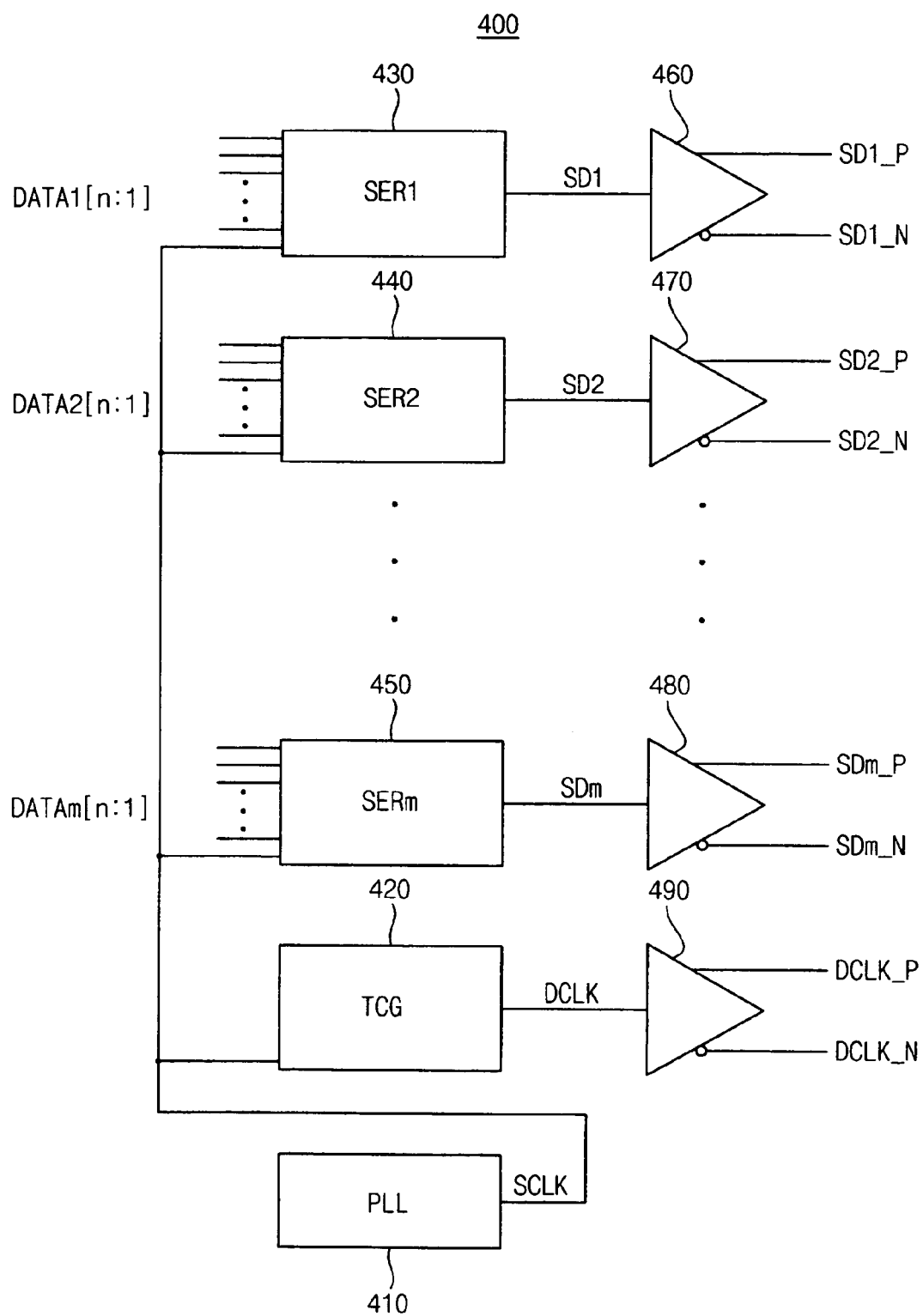
FIG. 5 is a block diagram illustrating a data transmission circuit according to another example embodiment.

FIG. 5 is a block diagram illustrating a data transmission circuit 400 according to another example embodiment.

Referring to FIG. 5, the data transmission circuit 400 may include a serial clock generator 410, a transmission clock generator 420, and a plurality of serializers 430, 440, and 450. The data transmission circuit 400 may further include a plurality of data buffers 460, 470, and 480 and a clock buffer 490.

Each of the serializers 430, 440, and 450 may receive N-bit parallel data DATA1[n:1], DATA2[n:1], . . . , DATAm[n:1], respectively. The transmission clock generator 420 may receive a serial clock SCLK to generate a transmission clock DCLK. Structure and operation of the respective serializers 430, 440, and 450 of FIG. 5 are similar or substantially similar to the structure and the operation of the serializer 30 of FIGS. 1 and 2, and thus the description thereof will be omitted for the sake of clarity and brevity. Structure and operation of the transmission clock signal generator 420 of FIG. 5 are similar to the structure and the operation of the transmission clock generator 20 of FIGS. 1 and 3, and thus the description thereof will be omitted. M data buffers 460, 470 and 480 may receive serial data SD1, SD2, . . . , SDm respectively, and convert each of the serial data SD1, SD2, . . . , SDm to each of first and second data signals SD1_P, SD1_M, SD2_P, SD2_M, . . . , SDm_P, and SDm_N that have reduced swing levels. The clock buffer 490 may receive the transmission clock DCLK to output first and second clock signals DCLK_P and DCLK_N that have reduced swing levels.

Figure 6:
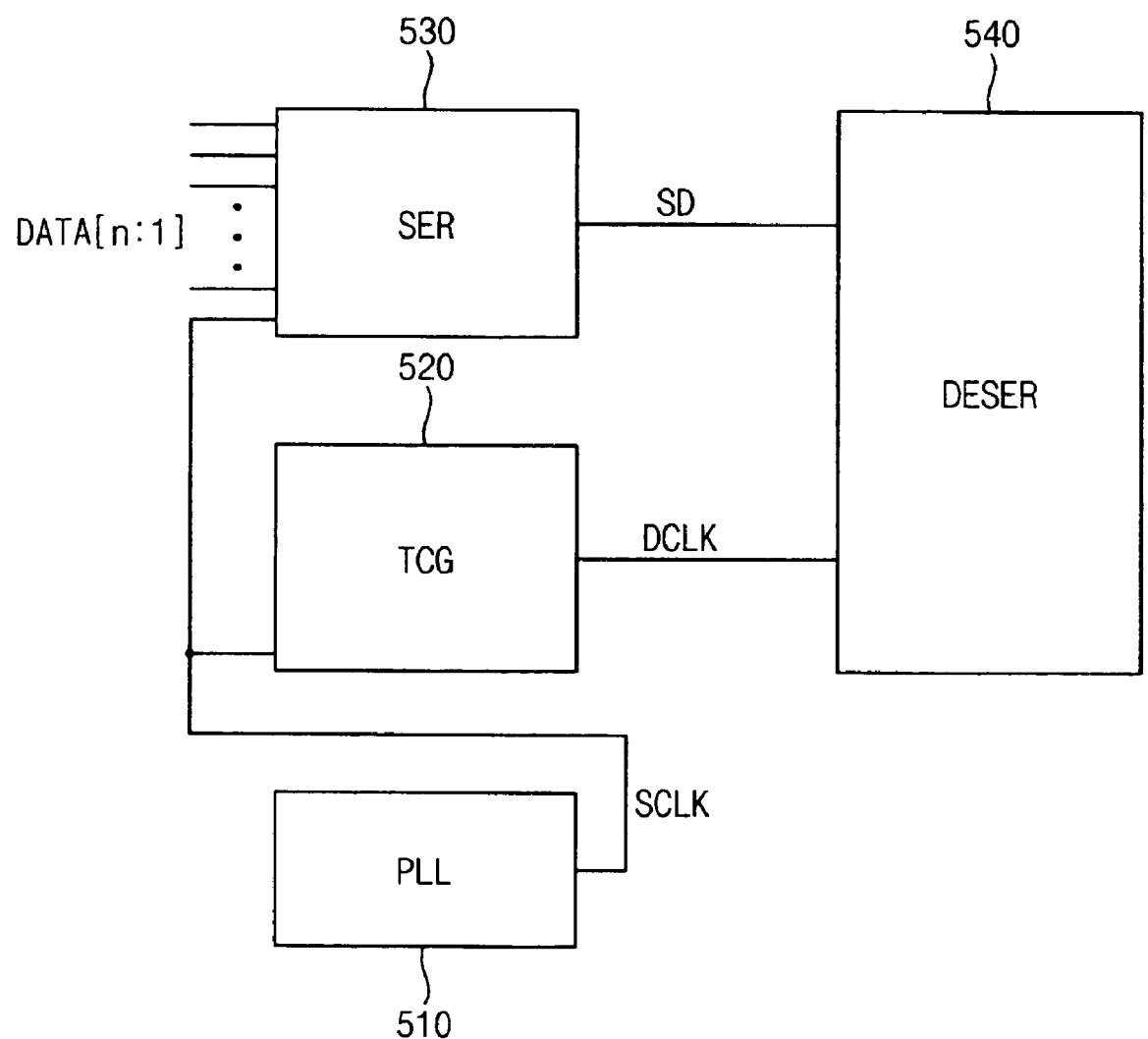
FIG. 6 is a block diagram illustrating a data transceiver system according to an example embodiment.

FIG. 6 is a block diagram illustrating a data transceiver system 500 according to an example embodiment.

Referring to FIG. 5, the transceiver system 500, that is, the data transmission and reception system 500 may include a serial clock generator 510, a transmission clock generator 520, a serializer 530, and a deserializer 540.

The serial clock generator 510 may generate a serial clock SCLK. The serializer 530 may receive N-bit parallel data and serialize the received N-bit parallel data to N-bit serial data SD in synchronization with the serial clock SCLK. The transmission clock generator 520 may receive the serial clock SCLK to generate a transmission clock DCLK that has a same delay as the N-bit serial data SD. Structures and operations of the serial clock generator 510, the serializer 530, and the transmission clock generator 520 of FIG. 6 are similar or substantially similar to the structure and the operation of the serial clock generator 10, the serializer 20 and the transmission clock signal generator 30 of FIG. 1 respectively, and thus, the description thereof will be omitted for the sake of clarity and brevity.

The deserializer 540 may receive the N-bit serial data SD and the serial clock DCLK that may be simultaneously transmitted and convert the N-bit serial data SD to N-bit parallel data in synchronization with the transmission clock DCLK.

The deserializer 540 may have a circuit configuration that is symmetric with the serializer 530. The deserializer 540 may convert the N-bit serial data SD to N-bit parallel data. Descriptions of structure and operation of the deserializer 540 will be omitted because the deserializer 540 may have a circuit configuration that is symmetric with the serializer 530.

Hereinafter, there will be description about a method of transmitting data according to an example embodiment with reference to FIG. 1 again.

Referring to FIG. 1, a serial clock SCLK may be generated and N-bit parallel data may be converted to N-bit serial data SD in synchronization with the serial clock SCLK. A transmission clock DCLK may be generated by delaying the serial clock. The transmission clock DCLK may have a same delay as the N-bit serial data SD. The N-bit serial data SD and the transmission clock DCLK may be simultaneously transmitted. The N-bit serial data SD may be converted to first and second data signal SD_P and SD_N that have reduced swing levels. The transmission clock DCLK may be converted to first and second clock signals DCLK_P and DCLK_N that have reduced swing levels. The first and second data signal SD_P and SD_N and the first and second clock signals DCLK_P and DCLK_N may be simultaneously transmitted.

As mentioned above, when data are transmitted and/or received at high speed, data may be easily recovered in a receiver by reducing skews between data and clock because the transmission clock and the serial data have a same delay in case of the parallel data being converted to the serial data.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A data transmission circuit, comprising:
a serial clock generator configured to generate a serial clock;
a serializer configured to serialize N-bit parallel data to N-bit serial data in synchronization with the serial clock, N being a natural number greater than one; and a transmission clock generator configured to receive the serial clock to generate a transmission clock, the data transmission circuit simultaneously transmitting the N-bit serial data and the transmission clock, wherein the transmission clock generator includes,
a plurality of multiplexers, each of the plurality of multiplexers having a first input terminal that receives a first or second logic value level and a second input terminal that receives a shifted logic value based on the first and second logic value level, the first and second logic value levels alternating among the plurality of multiplexers, and
a plurality of flip-flops, each of the plurality of flip-flops receiving an output from one of the plurality of multiplexers, the plurality of flip-flops configured to receive and delay outputs of the plurality of multiplexers to provide the transmission clock.

2. The data transmission circuit of claim 1, wherein the serializer and the transmission clock generator have a same circuit configuration.

3. The data transmission circuit of claim 1, further comprising:
a data buffer configured to receive the N-bit serial data to convert the received N-bit serial data into first and second data signals that have reduced swing levels; and
a clock buffer configured to receive the transmission clock to convert the received the transmission clock into first and second clock signals that have reduced swing levels.

4. The data transmission circuit of claim 3, wherein the first and second data signals are differential signals.

5. The data transmission circuit of claim 3, wherein the first and second clock signals are differential signals.

6. The data transmission circuit of claim 1, wherein the serializer comprises:
a plurality of multiplexers, each of the plurality of multiplexers having a first input terminal that receives a bit of the N-bit parallel data, and a second input terminal that receives a shifted value of a previous bit of the N-bit parallel data; and
a plurality of flip-flops, each of the plurality of flip-flops receiving an output from one of the plurality of multiplexers, the plurality of flip-flops configured to receive and delay outputs of the plurality of multiplexers to provide the N-bit serial data.

7. The data transmission circuit of claim 6, wherein the serializer provides the N-bit serial data by shifting the N-bit parallel data input by one bit when a first control signal input to the plurality of multiplexers is enabled.

8. The data transmission circuit of claim 1, wherein the transmission clock generator provides the transmission clock by shifting the first and second logic value levels when a control signal input to the plurality of multiplexers is enabled.

9. The data transmission circuit of claim 8, wherein the transmission clock has a period that is two times longer than a period of the serial clock.

10. A data transmission and reception system comprising: the data transmission circuit of claim 1.

11. The data transmission and reception system of claim 10, wherein the serializer comprises:
a plurality of multiplexers, each of the plurality of multiplexers having a first input terminal that receives a bit of the N-bit parallel data, and a second input terminal that receives a shifted value of a previous bit of the N-bit parallel data; and
a plurality of flip-flops receiving an output from one of the plurality of multiplexers, the plurality of flip-flops configured to receive and delay outputs of the plurality of multiplexers to provide the N-bit serial data.

12. The data transmission and reception system of claim 10 further comprising:
a deserializer configured to receive the N-bit serial data and the second clock to deserialize the N-bit serial data to the N-bit parallel data in synchronization with the first clock, the N-bit serial data and the second clock being simultaneously transmitted.

13. The data transmission and reception system of claim 12, wherein the deserializer is configured to deserailize the N-bit serial data to the N-bit parallel data by having a symmetric circuit configuration with respect to the serializer.

14. The data transmission and reception system of claim 12, wherein the serializer comprises:
a plurality of multiplexers, each of the plurality of multiplexers having a first input terminal that receives a bit of the N-bit parallel data, and a second input terminal that receives a shifted value of a previous bit of the N-bit parallel data; and
a plurality of flip-flops receiving an output from on of the plurality of multiplexers, the plurality of flip-flops configured to receive and delay outputs of the plurality of multiplexers to provide the N-bit serial data.

* * * * *